United States Patent
Hashimoto et al.

(10) Patent No.: US 9,255,342 B2
(45) Date of Patent: Feb. 9, 2016

(54) BISMUTH-DOPED SEMI-INSULATING GROUP III NITRIDE WAFER AND ITS PRODUCTION METHOD

(71) Applicants: SIXPOINT MATERIALS, INC., Buellton, CA (US); Seoul Semiconductor Co., Ltd., Seoul (KR)

(72) Inventors: Tadao Hashimoto, Santa Barbara, CA (US); Edward Letts, Buellton, CA (US); Sierra Hoff, Solvang, CA (US)

(73) Assignees: SixPoint Materials, Inc., Buellton, CA (US); Seoul Semiconductor Co., Ltd., Seoul (KR)

(*) Notice: Subject to any disclaimer, the term of this patent is extended or adjusted under 35 U.S.C. 154(b) by 0 days.

(21) Appl. No.: 13/781,543

(22) Filed: Feb. 28, 2013

(65) Prior Publication Data

US 2014/0054589 A1 Feb. 27, 2014

Related U.S. Application Data

(60) Provisional application No. 61/693,122, filed on Aug. 24, 2012.

(51) Int. Cl.
| | |
|---|---|
| *C30B 7/10* | (2006.01) |
| *B28D 5/00* | (2006.01) |
| *H01L 21/02* | (2006.01) |
| *H01L 29/20* | (2006.01) |
| *H01L 29/22* | (2006.01) |

(Continued)

(52) U.S. Cl.
CPC . *C30B 7/105* (2013.01); *B28D 5/00* (2013.01); *C30B 9/00* (2013.01); *C30B 28/04* (2013.01); *C30B 29/403* (2013.01); *H01L 21/02389* (2013.01); *H01L 29/2003* (2013.01); *H01L 29/22* (2013.01)

(58) Field of Classification Search
None
See application file for complete search history.

(56) References Cited

U.S. PATENT DOCUMENTS

| | | | |
|---|---|---|---|
| 6,379,472 B1 | 4/2002 | Kisielowski et al. | |
| 2003/0157376 A1* | 8/2003 | Vaudo et al. | 428/698 |

(Continued)

FOREIGN PATENT DOCUMENTS

| | | |
|---|---|---|
| WO | WO2005/121415 A1 | 12/2005 |
| WO | WO 2005/121415 A1 | 12/2005 |

(Continued)

OTHER PUBLICATIONS

PCT/US2013/028416 International Search Report and Written Opinion mailed Jul. 30, 2013.

(Continued)

*Primary Examiner* — Khaja Ahmad
(74) *Attorney, Agent, or Firm* — Strategic Innovation IP Law Offices, P.C.

(57) ABSTRACT

The present invention discloses a semi-insulating wafer of $Ga_xAl_yIn_{1-x-y}N$ ($0 \le x \le 1$, $0 \le x+y \le 1$) which is doped with bismuth (Bi). The semi-insulating wafer has the resistivity of $10^4$ ohm-cm or more. Although it is very difficult to obtain a single crystal ingot of group III nitride, the ammonothermal method can grow highly-oriented poly or single crystal ingot of group III nitride having the density of dislocations/grain boundaries less than $10^5$ cm$^{-2}$. The invention also disclose the method of fabricating the semi-insulating group III nitride bulk crystals and wafers.

17 Claims, 2 Drawing Sheets

1. Growth of a Bi-doped group III nitride bulk crystal by ammonothermal method or other bulk growth method 2. Slicing the Bi-doped group III nitride bulk crystal to fabricate wafers 3. Grinidng, lapping and polishing of the sliced wafers

(51) Int. Cl.
*C30B 9/00* (2006.01)
*C30B 28/04* (2006.01)
*C30B 29/40* (2006.01)

(56) References Cited

U.S. PATENT DOCUMENTS

| | | | |
|---|---|---|---|
| 2005/0009310 | A1 | 1/2005 | Vaudo et al. |
| 2006/0207497 | A1* | 9/2006 | D'Evelyn et al. ............... 117/71 |
| 2008/0303032 | A1* | 12/2008 | Dwilinski et al. ............... 257/76 |
| 2010/0001289 | A1* | 1/2010 | Frayssinet et al. ............... 257/76 |
| 2010/0068118 | A1* | 3/2010 | Hashimoto et al. ........... 423/409 |
| 2010/0230687 | A1* | 9/2010 | Hashimoto et al. ............... 257/76 |
| 2011/0217505 | A1* | 9/2011 | Callahan ........................ 428/80 |

FOREIGN PATENT DOCUMENTS

| | | |
|---|---|---|
| WO | WO 2006/010075 | 1/2006 |
| WO | WO 2007/133512 A2 | 11/2007 |
| WO | WO2007/133512 A2 | 11/2007 |
| WO | WO2009/149300 A1 | 12/2009 |
| WO | WO 2009/149300 A1 | 12/2009 |
| WO | WO2009/151642 A1 | 12/2009 |
| WO | WO 2009/151642 A1 | 12/2009 |
| WO | WO2014/031152 | 2/2014 |

OTHER PUBLICATIONS

Wu, H. et al., "Rapid Synthesis of High Purity GaN Powder," Phys. Stat. Sol. (c), 2005, pp. 2074-2078, New York.

Ehrentraut, Dirk, et al., Technology of Gallium Nitride Crystal Growth; Springer Series in Materials Science ISSN 0933-033X; ISBN 978-3-642-04828-9; e-ISBN 978-3-642-04830-2; DOI 10.1007/978-3-642-04830-2; Springer Heidelberg Dordrecht London New York; pp. 266-273.

Thomas, Tiju; Rare Earth Doped Gallium Nitride Powders: Synthesis, Purification Luminescence Enhancement, Nanosizing, Luminescence Mechanism Investigation and Large Area Deposition; A Dissertation Presented to the Faculty of the Graduate School of Cornell University in Partial Fulfillment of the Requirements for the Degree of the Doctor of Philosophy; Jan. 2011; 158 pp.

Novikov, S.V., et al., Bismuth a new dopant for GaN films grown by molecular beam epitaxy-surfactant effects, formation of $GaN_{1-x}Bi_x$ alloys and co-doping with arsenic; Journal of Crystal Growth (Impact Factor. 1.55) Jan. 2003; 247(1)35-41, DOI: 10.1016/S0022-0248(02)01914-0; ResearchGate; 2 pp.

Novikov, S.V., et al.; Molecular Beam Epitaxy of $GaN_{1-x}Bi_x$ alloys with high Bi content; The University of Nottingham; School of Physics and Astronomy, University of Nottingham, Nottingham NG7 2RD, UK; Materials Sciences Division, Lawrence Berkeley National Laboratory, 1 Cyclotron Road, Berkeley, CA 94720-8197, USA; Department of Materials Science & Engineering, University of California, Berkeley, CA 94720; Advanced Light Source, Lawrence Berkeley National Laboratory, 1 Cyclotron Road, Berkeley, CA 94720-8197, USA; Department of Physics, SUPA, University of Strathclyde, Glasgow, G4 ONG, UK, Novikov Bismuth 2011; 41 pp.

Cornell University Technical Brief of DiSalvo, F., et al.; Rapid Synthesis of Highly Pure GaN Powder; Cornell University Center of Technology Enterprise and Commercialization; 395 Pine Tree Road, Suite 310, Ithaca, NY 14850; www.cctec.cornell.edu; Reference: Office of the Vice Provost for Technology Transfer and Economic Development; 1p.

Lavander, Alejandro X., et al.; Growth and transport properties of p-type GaNBi alloys; J. Mater. Res., vol. 26, No. 23, Dec. 14, 2011; © Materials Research Society 2011; pp. 2887-2894.

Sefat, UCSB-ICMR Synthesis Summer School: "Flux Method for Preparing Crystals of Main Group Compounds," Oak Ridge National Laboratory, University of California, Santa Barbara, CA, pp. 1-57, Aug. 2010.

Tan, et al., "p-type Conduction in Unintentional Carbon-doped ZnO Thin Films," Applied Physics Letters 91, pp. 072101-1-072101-3, DOI: 10.1063/1.2768917, Aug. 14, 2007.

Oh, et al., "MOMBE Growth of Heavily Carbon-doped n-Type InP Using Tertiarybutylphosphine (TBP)," published in Indium Phosphide and Related Materials, Conference Proceedings, Seventh International Conference on May 9-13, 1995, pp. 797-800, DOI: 10.1109/ICIPRM.1995.522264.

Kang, et al., "Carbon-doped GaAs Single Junction Solar Microcells Grown in Multilayer Epitaxial Assemblies," Applied Physics Letters 102, AIP Publishing LLC (http://dx.doi.org/10.1063/1.4812399), pp. 253902-1-253902-5, Jun. 25, 2013.

Quivy, et al., "p-type Si-Doped Structures Grown by Molecular Beam Epitaxy on (311) A GaAs Substrates," Brazilian Journal of Physics, vol. 27/A, pp. 125-129, Dec. 4, 1997.

* cited by examiner

BISMUTH-DOPED SEMI-INSULATING GROUP III NITRIDE WAFER AND ITS PRODUCTION METHOD

CROSS REFERENCE TO RELATED APPLICATIONS

This application claims benefit of priority to U.S. Provisional Patent Application No. 61/693,122, filed Aug. 24, 2012, by Tadao Hashimoto, Edward Letts, and Sierra Hoff, entitled "BISMUTH-DOPED SEMI-INSULATING GROUP III NITRIDE WAFER AND ITS PRODUCTION METHOD,", which application is incorporated by reference herein in its entirety as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,";

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

which applications are incorporated by reference herein in their entirety as if put forth in full below.

BACKGROUND

1. Field of the Invention

The invention is related to a semiconductor wafer used for various devices including electronic devices such as transistors. More specifically, the invention is on a compound semiconductor wafer composed of group III nitride.

2. Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key material for various electronic devices such as microwave power transistors and solar-blind photo detectors. However, the majority of these devices are grown epitaxially on heterogeneous substrates (or wafers), such as sapphire and silicon carbide since GaN wafers are extremely expensive compared to these heteroepitaxial substrates. The heteroepitaxial growth of group III nitride causes highly defected or even cracked films, which hinder the realization of high-end electronic devices, such high-power microwave transistors.

To solve all fundamental problems caused by heteroepitaxy, it is indispensable to utilize group III nitride wafers sliced from bulk group III nitride crystal ingots. For the majority of devices, GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Currently, majority of commercially available GaN wafers are produced by a method called hydride vapor phase epitaxy (HVPE). HVPE is a vapor phase method, which has a difficulty in reducing dislocation density less than $10^5$ cm$^{-2}$.

To obtain high-quality GaN wafers of which density of dislocations and/or grain boundaries is less than $10^5$ cm$^{-2}$, a new method called ammonothermal growth has been developed [1-6]. Recently, high-quality GaN wafers having density of dislocations and/or grain boundaries less than $10^5$ cm$^{-2}$ can be obtained by the ammonothermal growth. However, a GaN ingot grown by the ammonothermal method typically shows n-type conductivity, which is not favorable to high-electron mobility transistors (HEMT). Due to high-frequency operation, conductive substrate causes high-level of capacitance loss through the substrate. To improve the performance of transistors, semi-insulating wafers are strongly demanded.

SUMMARY OF THE INVENTION

The present invention discloses a semi-insulating wafer of $Ga_xAl_yIn_{1-x-y}N$ ($0 \leq x \leq 1$, $0 \leq x+y \leq 1$) which is doped with bismuth (Bi). The semi-insulating wafer has the resistivity of $10^4$ ohm-cm or more. Although it is very difficult to obtain a single crystal ingot of group III nitride, the ammonothermal method can grow highly-oriented polycrystalline ingot of group III nitride having the density of dislocations/grain boundaries less than $10^5$ cm$^{-2}$.

BRIEF DESCRIPTION OF THE DRAWINGS

Referring now to the drawings in which like reference numbers represent corresponding parts throughout.

In the figure each number represents the followings.

1. a Bi-doped GaN bulk crystal

DETAILED DESCRIPTION OF THE INVENTION

Overview

The semi-insulating substrate of the present invention provides suitable properties for fabrication of GaN-based high-frequency transistors such as high electron mobility transistors (HEMT). Due to lack of single crystalline substrates of group III nitride, the GaN-based high-frequency transistors have been fabricated on so-called heteroepitaxial substrates such as sapphire, silicon and silicon carbide. Since the heteroepitaxial substrates are chemically and physically different from the group III nitride, the device contains high density of dislocations ($10^8 \sim 10^{10}$ $cm^{-2}$) generated enerated at the interface between the heteroepitaxial substrate and the device layer. Such dislocations deteriorate performance and reliability of devices, thus substrates composed of single crystalline group III nitride such as GaN and AlN have been developed. Currently, the majority of commercially available GaN substrates are produced using hydride vapor pressure epitaxy (HVPE), a process in which it is difficult to reduce the dislocation density to less than $10^5$ $cm^{-2}$. Although the dislocation density of HVPE-GaN substrates is a few orders of magnitude lower than GaN film on heteroepitaxial substrates, the dislocation density is still a few orders of magnitude higher than typical silicon devices in electronics. To achieve higher device performance, lower dislocation density is required. To attain dislocation density less than $10^5$ $cm^{-2}$, ammonothermal growth, which utilizes supercritical ammonia, has been developed to date. Currently, the ammonothermal method can produce GaN wafers with dislocation density less than $10^5$ $cm^{-2}$. However, the ammonothermal growth typically produces crystals with a high-level of electrons, thus the substrate is n type or n+ type. In order to use the low-defect ammonothermal wafers for transistor applications, it is necessary to increase the resistivity.

Technical Description of the Invention

The current invention of semi-insulating substrate is expected to maximize the benefit of low-dislocation group III substrates by the ammonothermal growth. To obtain semi-insulating GaN-based substrates, doping of transition metals has been proposed [7]. However, the disclosed method is focused on HVPE and not applicable for high-quality bulk crystal having dislocation density less than $10^5$ $cm^{-2}$. To attain low-dislocation group III nitride bulk crystals, bulk growth method such as ammonothermal method must be used. However, the doping efficiency of transition metals is not efficient in the ammonothermal growth. Therefore, we searched for a new dopant which is compatible with the ammonothermal method and will realize the semi-insulating characteristic in the group III-nitride substrate. Through our research we found Bi is suitable for doping in the ammonothermal growth.

Figure 1:
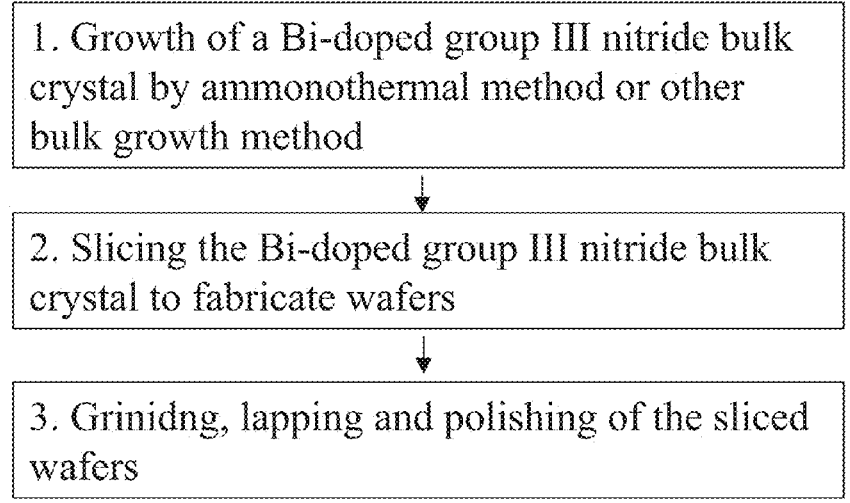
FIG. 1 is a typical process flow to fabricate a Bi-doped semi-insulating group III nitride wafer.

A typical process flow for preparing Bi-doped semi-insulating group III nitride wafer is presented in FIG. 1. By using ammonothermal method or other bulk growth method (such as flux method, high-pressure solution growth), a Bi-doped group III nitride bulk crystal is grown. The Bi-doped group III nitride bulk crystal should be large enough to be sliced into wafers. Also the Bi-doped group III nitride bulk crystal should be highly oriented poly or single crystalline with density of dislocations and/or grain boundaries less than $10^5$ $cm^{-2}$. The Bi-doped group III nitride bulk crystal is sliced into wafers with a multiple wire saw, and then the wafers are finished by grinding, lapping and polishing. By using bulk growth method such as ammonothermal method, dislocation density less than $10^5$ $cm^{-2}$ can be attained. For commercial use, substrate larger than 1" in diameter and thicker than 200 microns is favorable. The surface on which a device layer or structure is formed is polished to the atomic level. The polishing process typically consists of grinding with diamond tool, lapping with diamond slurry and polishing with colloidal silica. The finished wafer optionally can have a protective layer to protect the finished surface from chemical, physical and/or mechanical damage.

Example 1

Figure 2:
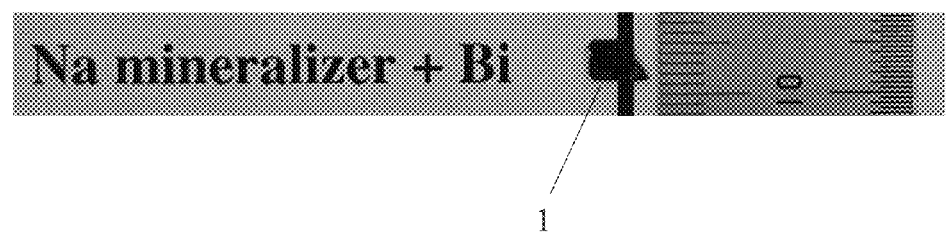
FIG. 2 is a picture of a Bi-doped GaN bulk crystal.

Bulk crystal of GaN was grown with the ammonothermal method using polycrystalline GaN as a nutrient, supercritical ammonia as a solvent, sodium (4.5 mol % to ammonia) as a mineralizer, and elemental Bi (6% to nutrient) as a dopant. The elemental Bi was placed together with the mineralizer. The growth temperature was between 500 to 600° C. and the growth was extended to 4 days. More than 200 micron-thick GaN was grown on a c-plane GaN seed crystal [FIG. 2]. The size of the crystal was approximately 10 $mm^2$. The crystal quality was characterized with X-ray diffraction. The full-width half maximum (FWHM) of 002 diffraction was 231 arcsec, and FWHM of 201 diffraction was 485 arcsec. Although diffraction from other planes such as 011, 110, 013, 020, 112, 004, 022, 121, 006 are not measured, similar number of FWHM is expected. Even with Bi doping, the crystal quality was not deteriorated significantly. The resistivity of the GaN crystal was measured with two-probe method. The separation of the proves was 2.5 mm and the applied voltage was 10 V. The current through the circuit was under the detection limit (10 micro A) of the ampere meter. From this experiment, we estimated the resistivity of $10^4$ ohm-cm or higher. As shown in FIG. 2, the crystal color was dark brown or black. Obviously, the optical absorption coefficient is higher than 10 $cm^{-1}$ throughout the visible wavelength range. Although the dislocation density was not measured on this particular crystal, we estimate the dislocation density at about $10^5$ $cm^{-2}$ or less based on the X-ray FWHM.

Advantages and Improvements

The current invention provides a semi-insulating III nitride wafers having dislocation density lower than $10^5$ $cm^{-2}$. Bi is an efficient dopant to grow semi-insulating group III nitride bulk crystal by ammonothermal growth. Even with heavy doping of Bi, the crystal quality was not deteriorated significantly. Wafers fabricated by slicing the Bi-doped group III nitride bulk crystal is expected to be suitable for electronic devices such as HEMT.

Possible Modifications

Although the preferred embodiment describes GaN substrates, the substrate can be group III nitride alloys of various composition, such as AlN, AlGaN, InN, InGaN, or GaAlInN.

Although the preferred embodiment describes ammonothermal growth as a bulk growth method, other growth method such as high-pressure solution growth, flux growth, hydride vapor phase epitaxy, physical vapor transport, or sublimation growth can be used.

Although the preferred embodiment describes c-plane GaN, other orientations such as a-face, m-face, and various semipolar surface can also be used. In addition, the surface can be slightly miscut (off-sliced) from these orientations.

Although the preferred embodiment describes metallic Bi as a dopant, Bi doped group III nitride such as Bi doped polycrystalline GaN, Bi doped amorphous GaN, Bi doped single crystalline GaN can be used for better control of the doping concentration.

Although Bi-doped group III nitride crystals are discussed above, other elements such as sulfur, selenium, antimony, tin, or lead or any combination of these may act as a dopant instead of or in combination with bismuth for semi-insulating group III nitride crystals.

REFERENCES

The following references are incorporated by reference herein:
[1] R. Dwiliński, R. Doradziński, J. Garczyński, L. Sierzputowski, Y. Kanbara, U.S. Pat. No. 6,656,615.
[2] R. Dwiliński, R. Doradziński, J. Garczyński, L. Sierzputowski, Y. Kanbara, U.S. Pat. No. 7,132,730.
[3] R. Dwiliński, R. Doradziński, J. Garczyński, L. Sierzputowski, Y. Kanbara, U.S. Pat. No. 7,160,388.
[4] K. Fujito, T. Hashimoto, S. Nakamura, International Patent Application No. PCT/US2005/024239, WO07008198.
[5] T. Hashimoto, M. Saito, S. Nakamura, International Patent Application No. PCT/US2007/008743, WO007117689. See also US20070234946, U.S. application Ser. No. 11/784,339 filed Apr. 6, 2007.
[6] D'Eyelyn, U.S. Pat. No. 7,078,731.
[7] Vaudo, et al., U.S. Pat. No. 7,170,095.

Each of the references above is incorporated by reference in its entirety as if put forth in full herein, and particularly with respect to description of methods of making using ammonothermal methods and using these gallium nitride substrates.

What is disclosed by way of example and not by way of limitation is:
1. A semi-insulating wafer comprising $Ga_xAl_yIn_{1-x-y}N$ ($0 \leq x \leq 1$, $0 \leq x+y \leq 1$) having a surface area more than 10 mm$^2$ and thickness more than 200 microns wherein the $Ga_xAl_yIn_{1-x-y}N$ is doped with bismuth.
2. A semi-insulating wafer of paragraph 1 wherein the resistivity of the wafer is higher than 10$^4$ ohm-cm.
3. A semi-insulating wafer of paragraph 1 or paragraph 2 wherein the crystal is fabricated by slicing a bulk ingot of $Ga_xAl_yIn_{1-x-y}N$ ($0 \leq x \leq 1$, $0 \leq x+y \leq 1$) grown in supercritical ammonia.
4. A semi-insulating wafer of any of paragraph 1 through paragraph 3 wherein the wafer comprises highly-oriented poly or single crystal of $Ga_xAl_yIn_{1-x-y}N$ ($0 \leq x \leq 1$, $0 \leq x+y \leq 1$) with a density of line defects and grain boundaries less than 10$^5$ cm$^{-2}$.
5. A semi-insulating wafer of any of paragraph 1 through paragraph 4 wherein the wafer is GaN.
6. A semi-insulating wafer of any of paragraphs 1-5 in which the $Ga_xAl_yIn_{1-x-y}N$ doped with bismuth has a resistivity greater than about 10$^4$ ohm-cm.
7. A semi-insulating wafer of any of paragraphs 1-6 wherein the $Ga_xAl_yIn_{1-x-y}N$ doped with bismuth has a density of dislocations and/or grain boundaries is less than 10$^5$ cm$^{-2}$.
8. A semi-insulating wafer of any of paragraphs 1-7 wherein the $Ga_xAl_yIn_{1-x-y}N$ doped with bismuth is a layer upon a group III-nitride substrate.
9. A semi-insulating wafer of any of paragraphs 1-7 wherein the wafer comprises, throughout the wafer, $Ga_xAl_yIn_{1-x-y}N$ doped with bismuth.
10. An electronic, optical, or opto-electronic device formed on a wafer of any of paragraphs 1-9.
11. A method of growing a bismuth doped group III nitride bulk crystal having a surface area more than 10 mm$^2$ and thickness more than 200 microns comprising:
   (a) charging group III containing nutrient in a high-pressure reactor;
   (b) charging mineralizer in the high-pressure reactor;
   (c) charging at least one seed crystal in the high-pressure reactor;
   (d) charging bismuth-containing dopant in the high-pressure reactor;
   (e) charging ammonia in the high-pressure reactor;
   (f) sealing the high-pressure reactor;
   (g) providing sufficient heat to the ammonia to create supercritical state of ammonia; and
   (h) crystallizing group III nitride on the seed crystal.
12. A method of growing bismuth doped group III nitride bulk crystal in paragraph 11 wherein the bismuth-containing dopant is selected from metallic bismuth and bismuth doped group III nitride.
13. A method of growing bismuth doped group III nitride bulk crystal in paragraph 11 and paragraph 12 wherein the group III nitride crystallized on the seed crystal is GaN.
14. A method of growing bismuth doped group III nitride bulk crystal from paragraph 11 through paragraph 13 wherein the seed crystal is GaN.
15. A method of growing bismuth doped group III nitride bulk crystal from paragraph 11 through paragraph 14 wherein the mineralizer contains alkali metal.
16. A method of growing bismuth doped group III nitride bulk crystal from paragraph 11 through paragraph 15 wherein the mineralizer contains sodium.
17. A method of growing bismuth doped group III nitride bulk crystal from paragraph 11 through paragraph 16 wherein a sufficient amount of the bismuth-containing dopant is present such that the crystallized group III nitride is semi-insulating.
18. A method of fabricating bismuth doped group III nitride semi-insulating wafers comprising the step of growing bismuth doped group III nitride bulk crystal as specified in paragraphs 11 through paragraph 17 and slicing of the bulk crystal.
19. A method of fabricating bismuth doped group III nitride semi-insulating wafers in paragraph 18 further comprising polishing of the surface on which device is fabricated.

What is claimed is:
1. A semi-insulating wafer comprising crystalline $Ga_xAl_yIn_{1-x-y}N$ ($0 \leq x \leq 1$, $0 \leq x+y \leq 1$) having a surface area more than 10 mm$^2$ and thickness more than 200 microns wherein the crystalline $Ga_xAl_yIn_{1-x-y}N$ is doped with a sufficient amount of bismuth to make the wafer semi-insulating.
2. The semi-insulating wafer of claim 1 wherein a resistivity of the wafer is greater than 10$^4$ ohm-cm.
3. The semi-insulating wafer of claim 1 wherein the wafer is fabricated by slicing a bulk ingot of $Ga_xAl_yIn_{1-x-y}N$ ($0 \leq x \leq 1$, $0 \leq x+y \leq 1$) grown in supercritical ammonia.
4. The semi-insulating wafer of claim 1 wherein the wafer comprises highly-oriented poly or single crystalline $Ga_x$-

$Al_yIn_{1-x-y}N$ ($0 \leq x \leq 1$, $0 \leq x+y \leq 1$) with a density of line defects and grain boundaries less than $10^5$ cm$^{-2}$.

5. The semi-insulating wafer of claim 1 wherein the wafer is GaN.

6. The semi-insulating wafer of claim 1 in which the $Ga_xAl_yIn_{1-x-y}N$ doped with bismuth has a resistivity greater than about $10^4$ ohm-cm.

7. The semi-insulating wafer of claim 1 wherein the $Ga_xAl_yIn_{1-x-y}N$ doped with bismuth has a density of dislocations and/or grain boundaries of less than $10^5$ cm$^{-2}$.

8. The semi-insulating wafer of claim 1 wherein the $Ga_xAl_yIn_{1-x-y}N$ doped with bismuth is a layer upon a group III-nitride substrate.

9. The semi-insulating wafer of claim 1 wherein the wafer comprises, throughout the wafer, $Ga_xAl_yIn_{1-x-y}N$ doped with bismuth.

10. An electronic, optical, or opto-electronic device formed on the semi-insulating wafer of claim 1.

11. The semi-insulating wafer of claim 6 wherein the $Ga_xAl_yIn_{1-x-y}N$ doped with bismuth has a density of line defects and/or grain boundaries of less than $10^5$ cm$^{-2}$.

12. The semi-insulating wafer of claim 11 wherein the $Ga_xAl_yIn_{1-x-y}N$ doped with bismuth is fabricated by slicing a bulk ingot of $Ga_xAl_yIn_{1-x-y}N$ ($0 \leq x \leq 1$, $0 \leq x+y \leq 1$) grown in supercritical ammonia.

13. The semi-insulating wafer of claim 12 wherein the $Ga_xAl_yIn_{1-x-y}N$ doped with bismuth is GaN doped with bismuth.

14. The semi-insulating wafer of claim 11 wherein the $Ga_xAl_yIn_{1-x-y}N$ doped with bismuth is GaN doped with bismuth.

15. The semi-insulating wafer of claim 4 wherein the $Ga_xAl_yIn_{1-x-y}N$ doped with bismuth is fabricated by slicing a bulk ingot of $Ga_xAl_yIn_{1-x-y}N$ ($0 \leq x \leq 1$, $0 \leq x+y \leq 1$) grown in supercritical ammonia.

16. The semi-insulating wafer of claim 15 wherein the $Ga_xAl_yIn_{1-x-y}N$ doped with bismuth is GaN doped with bismuth.

17. The semi-insulating wafer of claim 4 wherein the $Ga_xAl_yIn_{1-x-y}N$ doped with bismuth is GaN doped with bismuth.

* * * * *